US008288822B2

(12) United States Patent
Shih et al.

(10) Patent No.: US 8,288,822 B2
(45) Date of Patent: Oct. 16, 2012

(54) ESD PROTECTION STRUCTURES ON SOI SUBSTRATES

(75) Inventors: Jiaw-Ren Shih, Hsin-Chu (TW); Jian-Hsing Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/172,555

(22) Filed: Jun. 29, 2011

(65) Prior Publication Data

US 2011/0254091 A1 Oct. 20, 2011

Related U.S. Application Data

(62) Division of application No. 12/176,166, filed on Jul. 18, 2008, now Pat. No. 7,994,577.

(51) Int. Cl.
 *H01L 27/06* (2006.01)
(52) U.S. Cl. ........ 257/355; 257/356; 257/360; 257/347; 257/350; 257/E27.112
(58) Field of Classification Search .................. 257/355, 257/356, 347, 360, 350, E27.112
See application file for complete search history.

(56) References Cited

U.S. PATENT DOCUMENTS

| | | | |
|---|---|---|---|
| 6,455,894 B1 * | 9/2002 | Matsumoto et al. | .......... 257/347 |
| 6,534,831 B2 | 3/2003 | Kato | |
| 6,664,599 B1 | 12/2003 | Chen et al. | |
| 6,894,324 B2 | 5/2005 | Ker et al. | |
| 6,987,303 B2 | 1/2006 | Yu | |
| 7,112,837 B2 * | 9/2006 | Hsu et al. | ....................... 257/295 |
| 7,196,378 B2 | 3/2007 | Ichikawa | |
| 7,563,653 B2 | 7/2009 | Lee et al. | |
| 2006/0065931 A1 | 3/2006 | Lee et al. | |
| 2007/0267700 A1 | 11/2007 | Russ et al. | |
| 2008/0258241 A1 * | 10/2008 | Sutardja | ........................ 257/401 |
| 2009/0114989 A1 | 5/2009 | Hamamoto | |
| 2009/0321832 A1 | 12/2009 | Ohmi et al. | |

* cited by examiner

*Primary Examiner* — Eugene Lee

(74) *Attorney, Agent, or Firm* — Slater & Matsil, L.L.P.

(57) ABSTRACT

An electrostatic discharge (ESD) protection circuit includes a buried oxide layer; a semiconductor layer on the buried oxide layer; and a first and a second MOS device. The first MOS device includes a first gate over the semiconductor layer; a first well region having a portion underlying the first gate; and a first source region and a first drain region in the semiconductor layer. The second MOS device includes a second gate over the semiconductor layer; and a second well region having a portion underlying the first gate. The second well region is connected to a discharging node. The first well region is connected to the discharging node through the second well region, and is not directly connected to the discharging node. The second MOS device further includes a second source region and a second drain region in the semiconductor layer and adjoining the second well region.

10 Claims, 7 Drawing Sheets

US 8,288,822 B2

ESD PROTECTION STRUCTURES ON SOI SUBSTRATES

This application is a divisional of U.S. patent application Ser. No. 12/176,166, filed Jul. 18, 2008, and entitled "ESD Protection Structures on SOI Substrates," which application is hereby incorporated herein by reference.

TECHNICAL FIELD

This invention relates generally to an electrostatic discharge (ESD) protection circuits, and more particularly to ESD protection circuits formed on silicon-on-insulator substrates.

BACKGROUND

It is well known that extremely high voltages can develop in the vicinity of an integrated circuit due to the build-up of static charges. A high potential may be generated to an input or output buffer of an integrated circuit, which may be caused by a person touching a package pin that is in electrical contact with the input or output buffer. When the electrostatic charges are discharged, a high current is produced at the package nodes of the integrated circuit. Electrostatic discharge (ESD) is a serious problem for semiconductor devices since it has the potential of destroying the entire integrated circuit.

The duration of the ESD transient is very short, typically in the order of nanoseconds, and the conventional circuit breakers cannot react quickly enough to provide adequate protection. For this reason, it has become a known practice to incorporate ESD devices in integrated circuits. Conventionally, bi-directional diode strings are coupled between the package pins to protect the respective circuit. Other ESD devices such as transistors are also being used.

The ESD devices are also widely used between power lines to protect the internal circuit coupled between power lines and to discharge ESD currents to the ground. Typically, a plurality of ESD devices is connected in parallel to increase the maximum ESD current that can flow through, without damaging, the ESD devices. FIGS. 1A and 1B illustrate a top view and a cross-sectional view, respectively, of a conventional ESD protection circuit formed on a silicon-on-insulator (SOI) substrate. The cross-sectional view as shown in FIG. 1B is taken along a plane crossing line G-G' in FIG. 1A. The SOI substrate includes buried oxide layer 2 underlying semiconductor layer 3 (FIG. 1B), and overlying semiconductor layer 1. Referring to FIG. 1A, the ESD protection circuit includes a plurality of MOS devices having gates 4, source regions 6, and drain regions 8. The channel regions of the MOS devices are located in p-well regions 10 (not shown in FIG. 1A, please refer to FIG. 1B), which are separated from each other by source regions 6 and drain regions 8. STI regions 14 further isolate source regions 6 and drain regions 8. Each of the p-well regions 10 is connected to P+ contacts 16 formed at the opposite ends of gates 4. The P+ contacts 16 are connected to overlying metal lines 18, and are interconnected together. Through metal lines 18, P+ contacts 16 are connected to Vss.

FIG. 1C illustrates an equivalent circuit of the ESD protection circuit shown in FIGS. 1A and 1B. Only the parasitic npn (bipolar) transistors are illustrated, wherein the drains regions 8 act as collectors, the source regions 6 act as emitters, and p-well regions 10 act as bases. Resistors 19 represent the parasitic resistances of p-well 10. In the case an ESD pulse occurs at drain region 8, one or more parasitic npn transistor is turned on, and the ESD current flows through the parasitic npn transistor, so that the voltage on drains 8 may be brought down.

The ESD protection circuit as shown in FIGS. 1A and 1B suffers from drawbacks. It has been found that the ESD protection circuits formed on SOI substrates have worse performance than the similar ESD protection circuits formed on bulk substrates. Particularly, the maximum ESD current that can flow through the ESD protection circuit as shown in FIGS. 1A and 1B is very small, and the ESD protection circuit may easily be damaged. However, SOI substrates are preferred for the good performance, such as low leakage currents, of the integrated circuits formed thereon. This posts a dilemma for designers to choose between high performance and good ESD protection ability. Therefore, new methods are needed to improve the ESD protection ability of ESD protection circuits on SOI substrates.

SUMMARY OF THE INVENTION

In accordance with one aspect of the present invention, an electrostatic discharge (ESD) protection circuit includes a buried oxide layer; a semiconductor layer on the buried oxide layer; and a first and a second MOS device. The first MOS device includes a first gate over the semiconductor layer; a first well region having a portion underlying the first gate; and a first source region and a first drain region in the semiconductor layer. The second MOS device includes a second gate over the semiconductor layer; and a second well region having a portion underlying the first gate. The second well region is connected to a discharging node. The first well region is connected to the discharging node through the second well region, and is not directly connected to the discharging node. The second MOS device further includes a second source region and a second drain region in the semiconductor layer and adjoining the second well region.

In accordance with another aspect of the present invention, an ESD protection circuit includes a buried oxide layer; a semiconductor layer on the buried oxide layer; and a first and a second MOS device. The first MOS device includes a first gate over the semiconductor layer; a first well region in the semiconductor layer and having a portion underlying the first gate, wherein the first well region includes a first end portion adjacent a first end of the first gate, and a second end portion adjacent a second end of the first gate, and wherein the first well region is not directly connected to any ground; and a first source region and a first drain region in the semiconductor layer. The ESD protection circuit further includes a metal line interconnecting the first and the second end portions of the first well region. The second MOS device includes a second gate over the semiconductor layer; and a second well region in the semiconductor layer and having a portion underlying the second gate, wherein the second well region includes a third end portion connected to the second end portion of the first gate, and a fourth end portion directly connected to a ground.

In accordance with yet another aspect of the present invention, an ESD protection circuit includes a buried oxide layer; a semiconductor layer on the buried oxide layer; a first P+ region in the semiconductor layer; a first contact plug over and connected to the first P+ region, wherein the first contact plug is directly connected to a ground; a first p-well region in the semiconductor layer and adjoining the first P+ region; a first gate over the first p-well region; a second P+ region in the semiconductor layer and adjoining first p-well region, wherein the second P+ region is on an opposite side of the first p-well region than the first P+ region; a second contact plug over and connected to the second P+ region, wherein the second contact plug is not directly connected to the ground; a second p-well region in the semiconductor layer and adjoining the second P+ region, wherein the first and the second p-well regions are physically separated from each other; and a second gate over the second p-well region.

By not allowing the well regions of ESD devices connected to discharging nodes directly, the ESD devices may be turned on substantially simultaneously by ESD transients, and hence the performance of the respective ESD protection circuit is improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel electrostatic discharge (ESD) protection circuit and the method of forming the same are provided. The variations and operation of the preferred embodiments are discussed. Throughout the various views and illustrative embodiments of the present invention, like reference numbers are used to designate like elements. In the discussed exemplary embodiment, the ESD device and an input/output (IO) device protected by the ESD device are NMOS devices. However, the concept of the present invention is readily applicable to PMOS ESD devices and PMOS 10 devices.

Figure 2A:
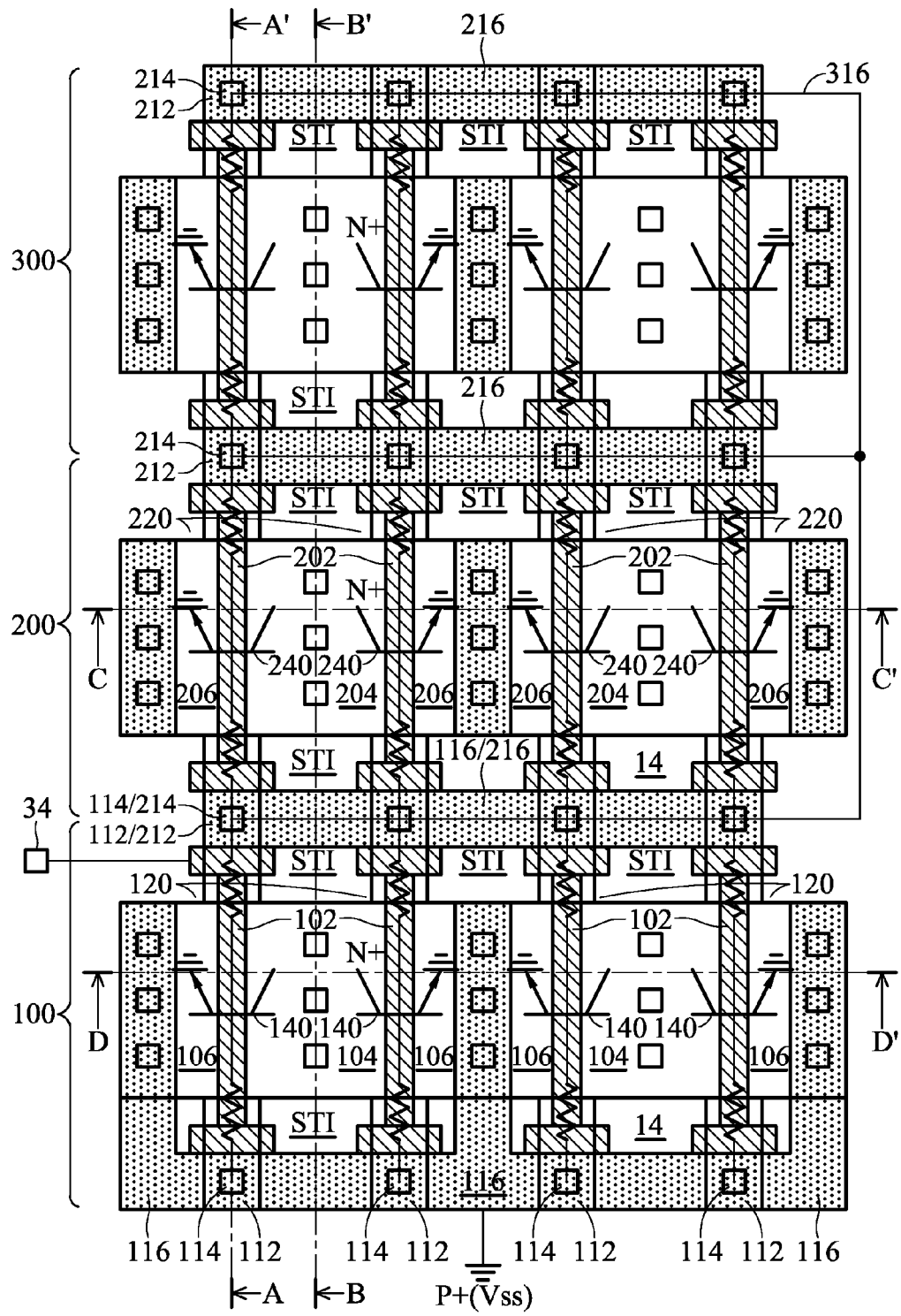
FIGS. 2A through 2D are a top view and cross-sectional views of an embodiment of the present invention.

FIG. 2A illustrates a top view of a layout of an embodiment of the present invention. IO device 100 is electrically connected to, and protected by, ESD device 200. IO device 100 is formed of a plurality of MOS devices (also referred to as fingers) 120 connected in parallel, with each of the MOS fingers 120 including gate 102, drain region 104, and source region 106. Drain regions 104 of the MOS fingers are interconnected. Source regions 106 of the MOS fingers are interconnected. Gates 102 of the MOS fingers 120 are also interconnected. The interconnections are made either by sharing common source or drain regions, or through metal lines (not shown) in metallization layers. The neighboring MOS fingers 120 either share common drain regions 104, or share common source regions 106.

Figure 2B:
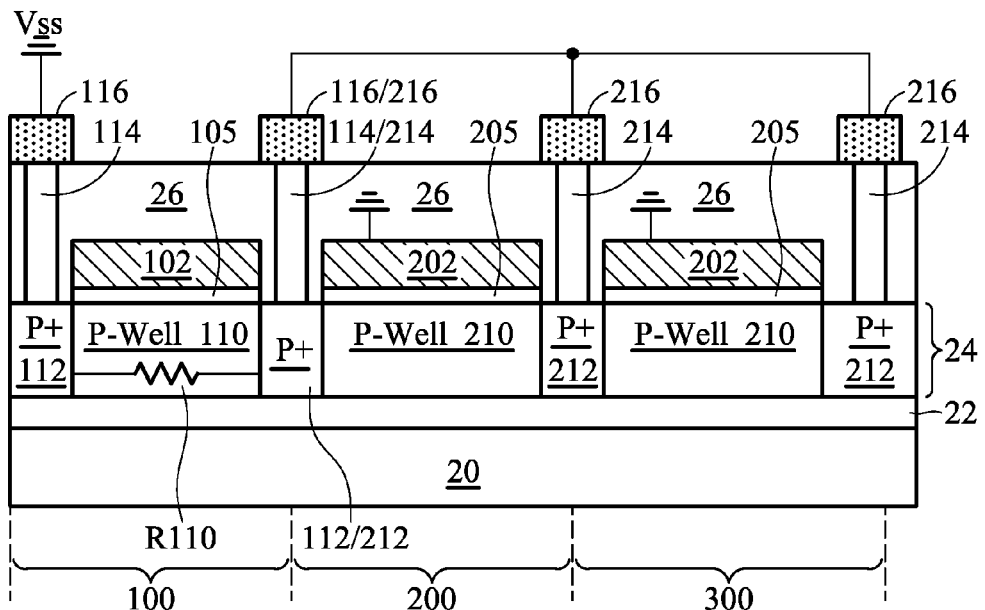

FIG. 2B illustrates a cross-sectional view taken along a plane crossing line A-A' in FIG. 2A. FIG. 2B illustrates that the embodiment of the present invention is formed on a silicon-on-insulator (STI) substrate, with buried oxide layer 22 on semiconductor layer 20, and semiconductor layer 24 on buried oxide layer 22. Semiconductor layer 24 is preferably a silicon layer, although other semiconductor materials can also be used. P-well regions 110, P+ regions 112/212 and source/drain regions 104/204/106/206 (not shown in FIG. 2B, please refer to FIGS. 2A and 2C) are formed in semiconductor layer 24, and preferably extend downward to contact buried oxide layer 22.

FIG. 2B shows that gates 102 are formed over p-well regions 110, with gate dielectrics 105 therebetween. P-well regions 110 extend beyond the ends of gates 102, at which heavily doped P-type (P+) regions 112 or 212 are formed in p-well regions 110, and are connected to contact plugs 114. For simplicity, the silicide regions formed between contact plugs 114 and P+ regions 112 are not shown. Contact plugs 114 are further connected to metal line 116, which are in the bottom metallization layer (commonly known as M1). At one end of the gates 102, metal line 116 is grounded (or connected to Vss), while on the other end, metal line (marked as 116/216, since the metal line is shared by ESD devices 100 and 200) is not connected to ground directly. Throughout the description, a node is referred to as being grounded either when it is connected to electrical ground (GND), or connected to Vss of the power supply. Referring back to FIG. 2A, metal line 116 interconnects all source regions 106 of MOS fingers 120, and hence all source regions 106 are grounded, preferably directly, with no other lightly-doped well regions therebetween.

Referring again to FIG. 2A, ESD device 200 is formed of a plurality of MOS devices (fingers) 220 connected in parallel, with each of the MOS fingers 220 including gate 202, drain region 204, and source region 206. Drain regions 204 of MOS fingers 220 are interconnected. Source regions 206 of MOS fingers 220 are interconnected. Gates 202 of the MOS fingers 220 are also interconnected. The interconnections are made either by sharing common source and drain regions, or through metal lines (not shown) in metallization layers.

IO device 100 and ESD device 200 have a difference in that the p-well regions 110 of MOS fingers 120 are connected to ground directly (through P+ pickup regions 112 and metal line 116), while the p-well regions 210 of ESD devices 200 are not connected to ground directly. Since the connection between p-well regions 110 and the ground are low resistive, with only P+ regions 112, metal contact plugs 114, and metal lines leading to the ground. The connection is considered to be a direct connection. Conversely, p-well regions 210 are connected to the ground through p-well regions 110 (represented by equivalent resistance R110). Due to the low doping concentration of p-well 110, which may be lower than about $2\times10^{17}/cm^3$, resistance R110 is typically high. Accordingly, p-well regions 210 are considered to be indirectly connected to the ground.

IO device 100 and ESD device 200 have a difference in that the p-well regions 110 of MOS fingers 120 are connected to ground directly (through P+ pickup regions 112 and metal line 116), while the p-well regions 220 of ESD devices 200 are not connected to ground directly. Since the connection between p-well regions 110 and the ground are low resistive, with only P+ regions 112, metal contact plugs 112, and metal lines leading to the ground. The connection is considered to be a direction connection. Conversely, p-well regions 210 are connected to the ground through p-well regions 110 (represented by equivalent resistance R110). Due to the low doping concentration of p-well 110, which may be lower than about $2 \times 10^{17}/cm^3$, resistance R110 is typically high. Accordingly, p-well regions 210 are considered to be indirectly connected to the ground.

Figure 2C:
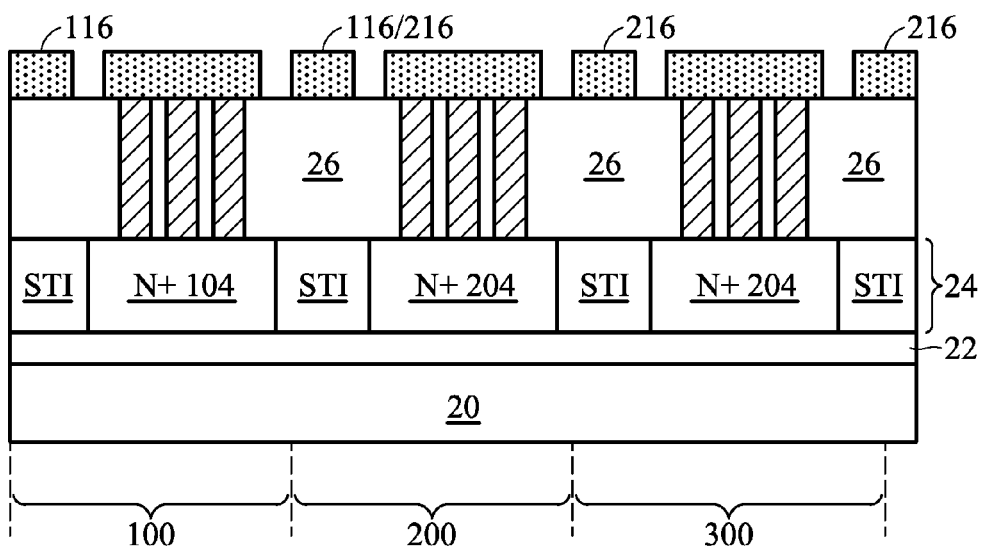

FIG. 2C illustrates another cross-sectional view of the structure shown in FIG. 2A, wherein the cross-sectional view is taken along a plane crossing line B-B' in FIG. 2A. It is noted that drain regions 104 and 204 are separated from each other by isolation regions, such as shallow-trench isolation (STI) regions. Similarly, each of the source regions 106 is separated from others by the STI regions.

Figure 2D:
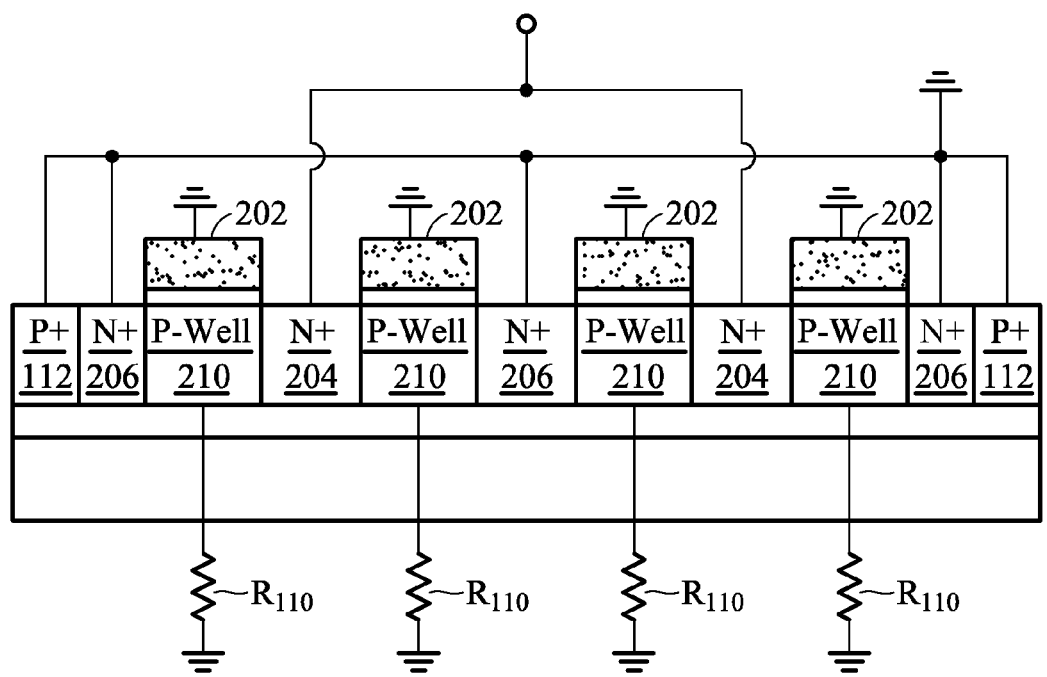

FIG. 2D illustrates yet another cross-sectional view of the structure shown in FIG. 2A, wherein the cross-sectional view is taken along a plane crossing line C-C' in FIG. 2A. Please note that p-well regions 210 are electrically isolated from each other by source/drain regions 204 and 206. Accordingly, the only electrical paths connecting p-well regions 210 to the ground are through p-well regions 110 (not shown in FIG. 2D), represented by resistors R110. If an additional cross-sectional view (not shown) of the a plane crossing line D-D' in FIG. 2A may is drawn, the cross-sectional view will be similar to the cross-sectional view shown in FIG. 2D, except that gates 102 of the IO MOS devices 120 may be connected to a internal signal node 34 (refer to FIG. 2A), instead of being grounded.

To increase the ESD current that can flow through the ESD device, additional ESD fingers can be connected in parallel to ESD device 200. FIG. 2A illustrates that ESD device 300 is electrically connected to ESD device 200. Again, the gates of the MOS fingers in ESD devices 300 are connected to gates 202 of MOS fingers in ESD device 200, the drain regions of the MOS fingers in ESD devices 300 are connected to the drain regions 204 of MOS fingers 220, and the source regions of the MOS fingers in ESD devices 300 are connected to the source regions 206 of MOS fingers 220. If higher ESD currents are expected, more ESD devices can be connected in parallel to ESD devices 200 and 300. Also, if the IO device 100 needs to handle greater IO currents, more IO MOS fingers can be added and connected to MOS fingers 120 in parallel. The p-well regions 210 of ESD MOS devices 200 and 300 are interconnected, for example, through metal line 316 (FIG. 2A). However, none of the p-well regions of the MOS device 300 are directly connected to the ground. Instead, they are connected to the ground through p-well regions 110.

Figure 3:
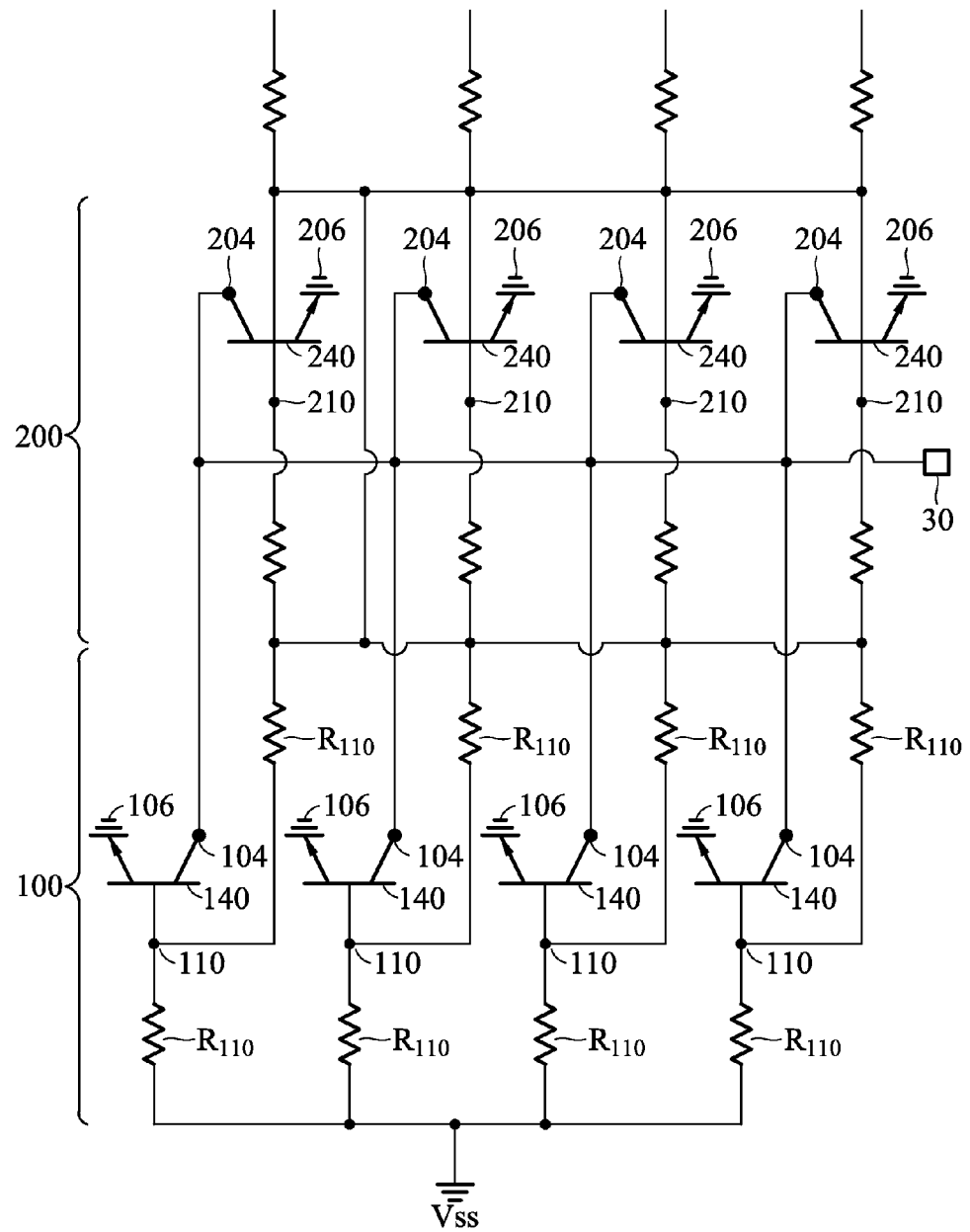
FIG. 3 illustrates an equivalent circuit diagram of the ESD protection circuit shown in FIGS. 2A through 2D.

FIG. 3 illustrates an equivalent circuit diagram representing the structure shown in FIG. 2A, wherein like reference numerals are used to denote like elements in FIGS. 2A and 3. For the sake of simplicity, the equivalent circuit of ESD device 300 is not shown. IO MOS device 100 includes parasitic bipolar transistors 140, which having p-well regions 110 as their bases, drain regions 104 as connectors, and source regions 106 as emitters. IO MOS devices 100 themselves have the function of discharging ESD charges through parasitic bipolar transistors 140, wherein when the drain regions 104, which may be connected to an external pad 30, has a high ESD voltage, the parasitic bipolar transistors 140 are turned on to discharge ESD charges to the ground, which acts as a discharging node.

ESD device 200 includes parasitic bipolar transistors 240, which have p-well regions 210 as their bases, drain regions 204 as connectors, and source regions 206 as emitters. An advantageous feature of the present invention is that the bases 210 are not connected to the ground directly. Accordingly, if the ESD voltage on pad 30 turns on one of the bipolar transistors 240, the voltage potentials on all of the bases 210 may be raised simultaneously, for example, to greater than about 0.7 volts. Therefore, all of the bipolar transistors 240 may be turned on simultaneously, and discharge ESD charges at the same time. This avoids the situation that may occur in conventional ESD protection circuits, in which all bases of the parasitic bipolar transistors are grounded, and hence it was possible that only one of the parasitic bipolar transistors was turned on. Since this parasitic bipolar transistor alone cannot handle the high ESD current, the ESD device itself may be damaged.

Although the embodiments discussed in the preceding paragraphs involve only NMOS devices, the teaching of the present invention may be applied to PMOS IO devices and/or PMOS ESD devices. The structures of the PMOS IO devices and PMOS ESD devices are essentially the same as shown in FIGS. 2A through 2D, except the conductivity types of the doped regions are inversed. Further, the respective metal lines 116 and source regions 106 and 206, instead of being connected to Vss or the ground, will be connected to Vdd, and using Vdd as a discharging node.

Table 1 compares the results obtained from a conventional ESD device (sample 1) and an embodiment of the present invention (sample 2), wherein samples 1 and 2 have same dimensions. In sample 1, the respective p-well regions of the ESD MOS fingers are connected to ground.

TABLE 1

|  | HBM | MM | IT2 |
|---|---|---|---|
| Sample 1 | 1 kV | 0 V | 0.091 Amps |
| Sample 2 | 3 kV | 125 V | 1.933 Amps |

The results shown in table 1 indicate that the embodiment of the present invention can endure much higher voltages in both human-body mode (HBM) and machine mode (MM). Further, the maximum current (IT2) that can flow through sample 2 without damaging the respective ESD device and IO device is much higher than the maximum current that can flow through sample 1.

Figure 4:
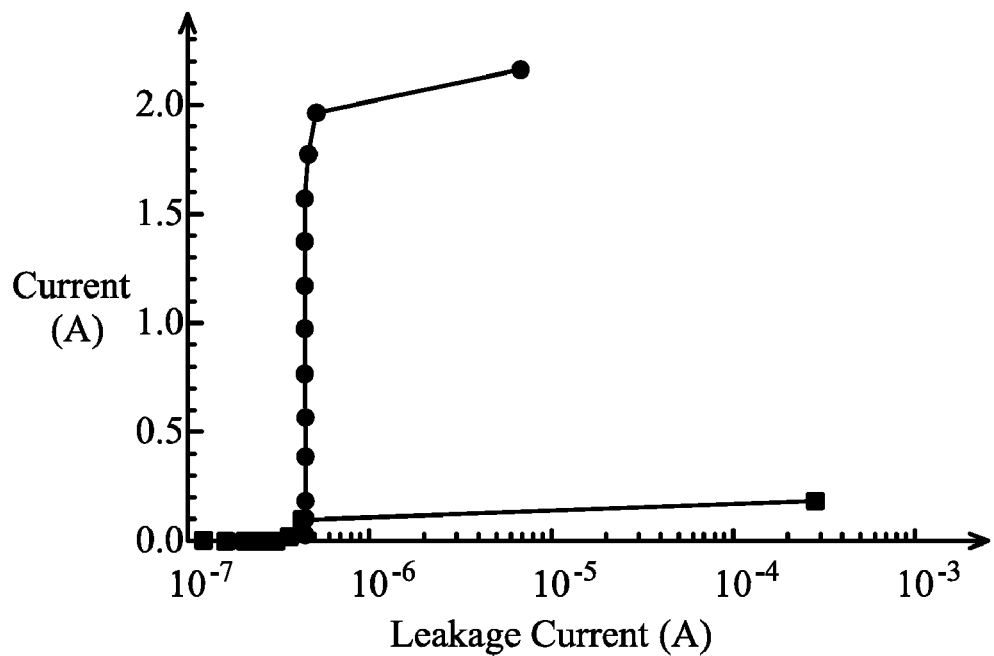
FIG. 4 illustrates stress currents of ESD devices as a function of leakage currents, wherein the results of a conventional ESD protection circuit and an embodiment of the present invention are compared.
Figure 5:
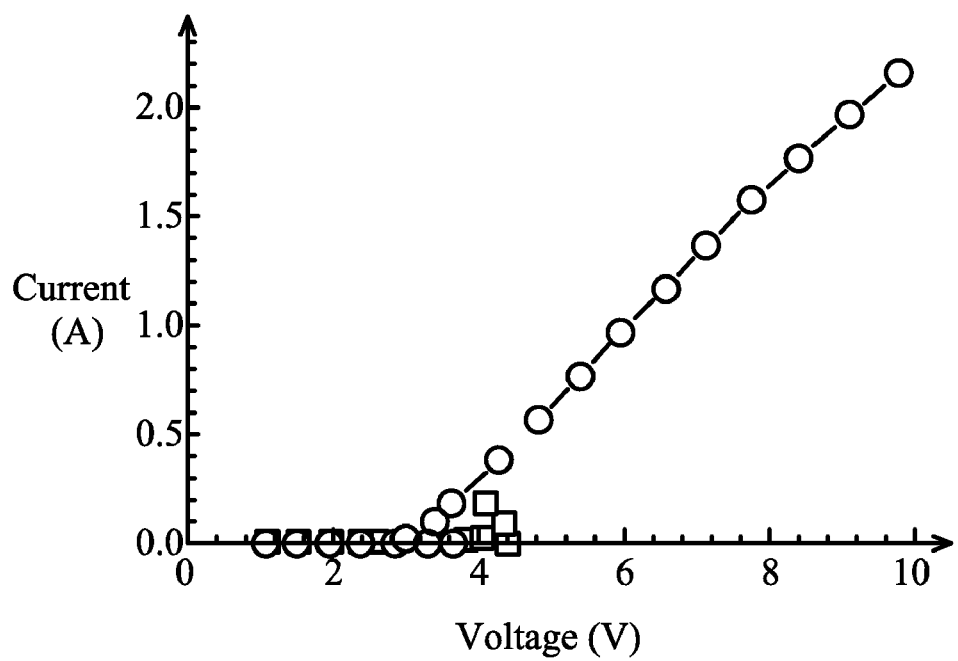
FIG. 5 illustrates currents of ESD devices as a function of applied voltages, wherein the performances of conventional ESD protection circuit and embodiments of the present invention are compared.

The effects of the preferred embodiments of the present invention are also shown in FIGS. 4 and 5. FIG. 4 illustrates stress currents of ESD devices as a function of leakage currents. The solid circles represent data obtained from embodiments of the present invention (first samples), while solid squares represent data obtained from conventional ESD devices shown in FIG. 1 (second samples). Each of the solid circles and solid squares are obtained by applying a current to stress one of the first and the second samples, and then measuring the leakage current of the sample. It is found that much greater current can be applied on first samples before they are damaged (the damage of the ESD device is made clear by the significant increase in leakage currents). As a comparison, very small current can be applied to the second samples before they are damaged.

Figure 1A:
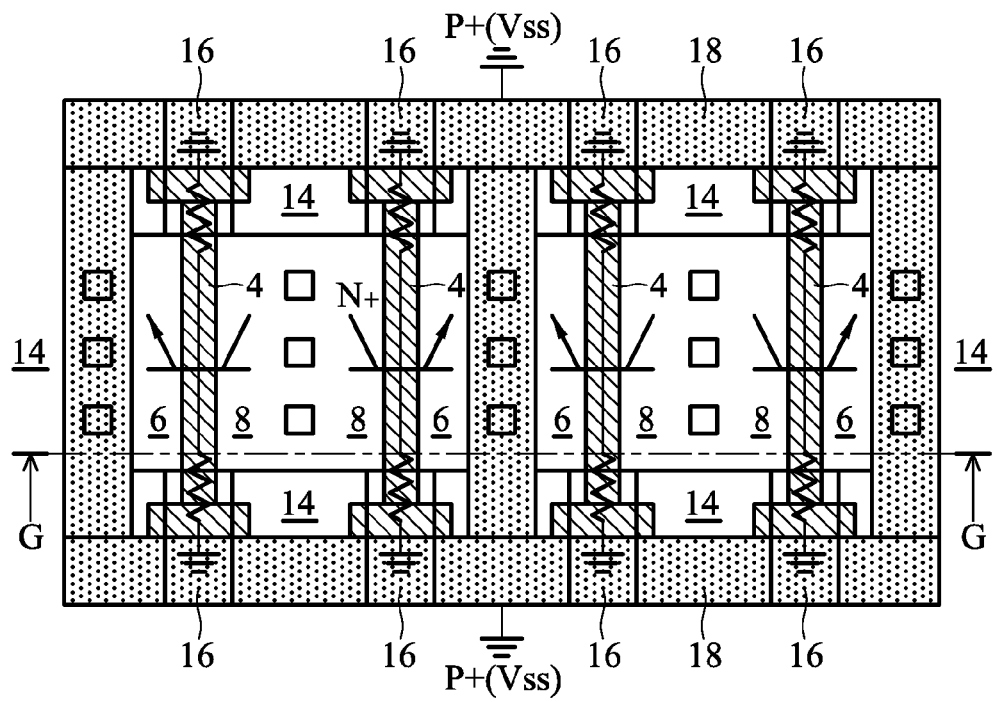
FIGS. 1A, 1B, and 1C illustrate a top view, a cross-sectional view, and a equivalent circuit diagram of a conventional electrostatic discharge (ESD) protection circuit formed on a silicon-on-insulator (SOI) substrate.
Figure 1B:
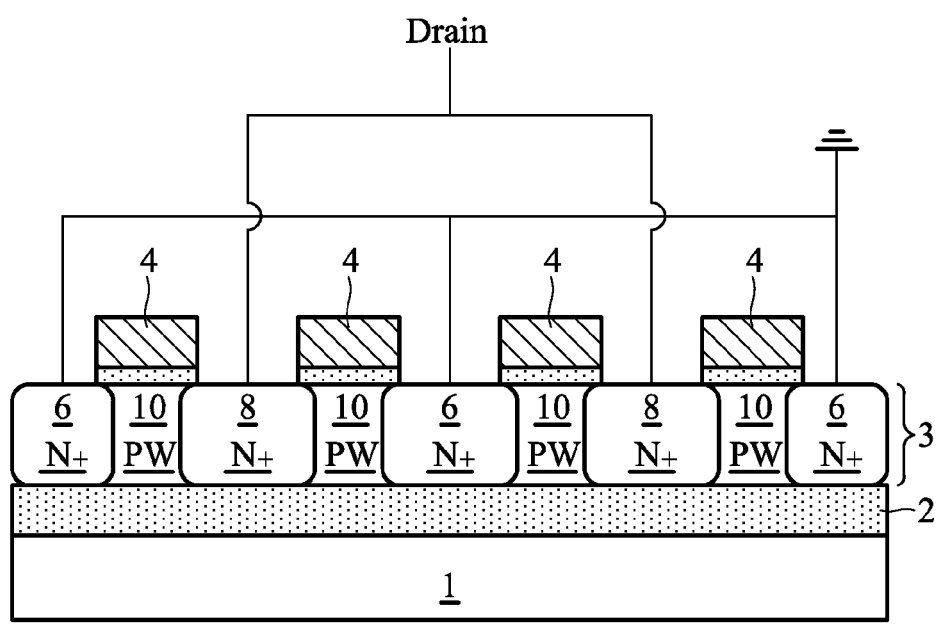
Figure 1C:
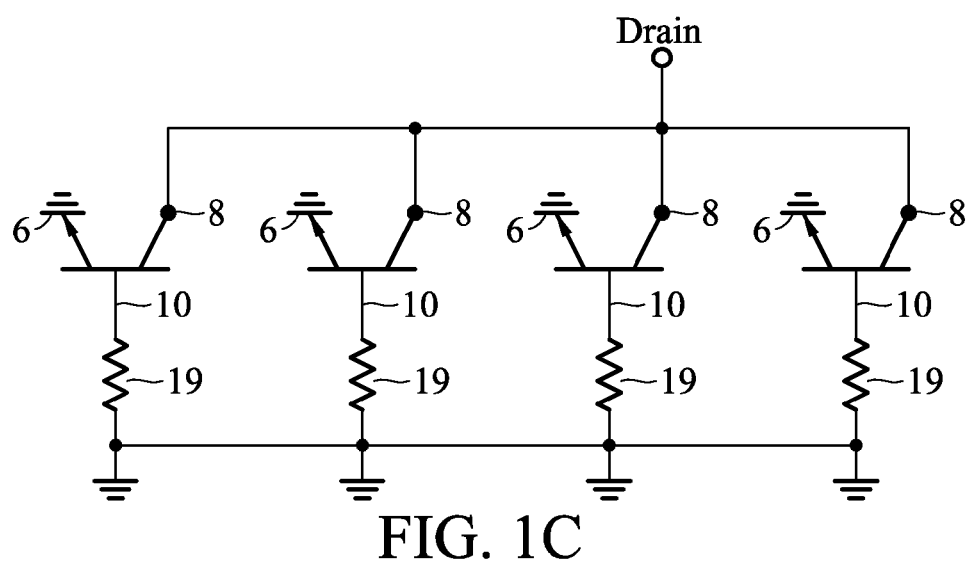

FIG. 5 illustrates currents of ESD devices as a function of voltages applied to the drain regions of the ESD MOS devices. The hollow circles represent data obtained from an embodiment of the present invention (a third sample), while hollow squares represent data obtained from a conventional ESD device as shown in FIG. 1 (a fourth sample). Each of the hollow circles and solid squares are obtained by zapping one of the samples with incremental currents, and determining the leakage current of the respective sample to determine whether the sample has been damaged or not after the application of each current. It is noted that within the range of applied currents, which correspond to voltages less than about 10 volts, the third sample was not damaged. As a comparison, the fourth sample was damaged (and the leakage current increases to about 7E-6 amps) when a current of about 0.2 amps to about 0.3 amps, which corresponds to a voltage of about 4.2 volts, was applied.

The embodiments of the present invention have several advantageous features. By indirectly connecting the p-well regions of ESD devices formed on SOI substrates to discharging nodes (Vss, GND, and/or Vdd), the parallel-connected ESD devices can be turned on simultaneously for discharging ESD charges. This significantly increases the reliability of The ESD devices. Advantageously, no extra process steps are needed for implementing the embodiments of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electrostatic discharge (ESD) protection circuit comprising:
   a buried oxide layer;
   a semiconductor layer over the buried oxide layer;
   a first MOS device comprising:
      a first gate over the semiconductor layer;
      a first well region in the semiconductor layer and having a portion underlying the first gate, wherein the first well region comprises a first end portion adjacent a first end of the first gate, and a second end portion adjacent a second end of the first gate, and wherein the first well region is not directly connected to any ground; and
      a first source region and a first drain region in the semiconductor layer;
   a metal line interconnecting the first and the second end portions of the first well region; and
   a second MOS device comprising:
      a second gate over the semiconductor layer; and
      a second well region in the semiconductor layer and having a portion underlying the second gate, wherein the second well region comprises a third end portion connected to the second end portion of the first gate, and a fourth end portion directly connected to a ground.

2. The ESD protection circuit of claim 1 further comprising a heavily doped well region adjoining, and has a same conductivity type as, the third end portion of the second well region and the second end portion of the first well region.

3. The ESD protection circuit of claim 1 further comprising:
   an additional heavily doped region adjoining the fourth end portion of the second well region;
   a contact plug connected to the additional heavily doped region; and
   an additional metal line overlying and electrically connected to the contact plug, wherein the additional metal line is directly connected to the ground.

4. The ESD protection circuit of claim 1, wherein the first and the second well regions are in physical contact with the buried oxide layer.

5. The ESD protection circuit of claim 1, wherein the first MOS device is an ESD device, and wherein the second MOS device is an input/output device.

6. An electrostatic discharge (ESD) protection circuit comprising:
   a buried oxide layer;
   a semiconductor layer over the buried oxide layer;
   a first P+ region in the semiconductor layer;
   a first contact plug over and connected to the first P+ region, wherein the first contact plug is directly connected to a ground;
   a first p-well region in the semiconductor layer and adjoining the first P+ region;
   a first gate over the first p-well region;
   a second P+ region in the semiconductor layer and adjoining the first p-well region, wherein the second P+ region is on an opposite side of the first p-well region than the first P+ region;
   a second contact plug over and connected to the second P+ region, wherein the second contact plug is not directly connected to the ground;
   a second p-well region in the semiconductor layer and adjoining the second P+ region, wherein the first and the second p-well regions are physically separated from each other; and
   a second gate over the second p-well region.

7. The ESD protection circuit of claim 6 further comprising:
   a third P+ region in the semiconductor layer and adjoining the second p-well region, wherein the third P+ region is on an opposite side of the second p-well region than the second P+ region;
   a third contact plug over and connected to the third P+ region; and
   a metal line over and connecting the second and the third contact plugs, wherein the metal line is not directly connected to the ground.

8. The ESD protection circuit of claim 6, wherein the first gate is disconnected from the ground, and wherein the second gate is connected to the ground.

9. The ESD protection circuit of claim 8 further comprising:
   a first source region in the semiconductor layer and adjoining the first p-well region; and
   a second source region in the semiconductor layer and adjoining the second p-well region, wherein the first and the second source regions are directly connected to the ground.

10. The ESD protection circuit of claim 8 further comprising:
    a first drain region in the semiconductor layer and adjoining the first p-well region; and
    a second drain region in the semiconductor layer and adjoining the second p-well region, wherein the first and the second drain regions are connected to an external pad.

* * * * *